United States Patent
Park et al.

(10) Patent No.: US 8,239,433 B2
(45) Date of Patent: Aug. 7, 2012

(54) DIRECT DIGITAL SYNTHESIZER AND NUCLEAR MAGNETIC RESONANCE INSTRUMENT USING THE SAME

(75) Inventors: Minseok Park, Hitachinaka (JP); Michiya Okada, Mito (JP); Shuya Hagiwara, Mito (JP); Hideki Tanaka, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 1092 days.

(21) Appl. No.: 12/120,385

(22) Filed: May 14, 2008

(65) Prior Publication Data

US 2008/0284470 A1    Nov. 20, 2008

(30) Foreign Application Priority Data

May 17, 2007    (JP) ................... 2007-131832

(51) Int. Cl.
     *G06F 1/02*      (2006.01)
(52) U.S. Cl. ...................................... 708/271
(58) Field of Classification Search .......... None
     See application file for complete search history.

(56) References Cited

U.S. PATENT DOCUMENTS

| | | | | |
|---|---|---|---|---|
| 4,951,004 A | * | 8/1990 | Sheffer et al. | 331/1 A |
| 5,673,212 A | * | 9/1997 | Hansen | 708/271 |
| 7,284,025 B2 | * | 10/2007 | Sullivan et al. | 708/271 |
| 7,576,616 B2 | * | 8/2009 | Iwasaki | 331/45 |
| 7,760,031 B2 | * | 7/2010 | Whittet et al. | 331/56 |

OTHER PUBLICATIONS

AD9956 Data Sheet Rev A, Analog Devices, 2004.
A Technical Tutorial on Digital Signal Synthesis, Analog Devices, 1999.

* cited by examiner

*Primary Examiner* — David H Malzahn
(74) *Attorney, Agent, or Firm* — Antonelli, Terry, Stout & Kraus, LLP.

(57) ABSTRACT

A DDS (direct digital synthesizer) remarkably increased in the number of frequencies which can be output while maintaining the phase coherency, and an NMR instrument using such a DDS are provided. A DDS including phase accumulators and a phase-to-amplitude modulator is provided with a plurality of phase accumulators operating with fixed phase implements which are equal to powers of 2, a controller for outputting each bit of a frequency tuning word as control data, a plurality of switches for outputting an output of an associated one of the phase accumulators when an associated one of the control data supplied from the controller is 1 and outputting 0 when the associated one of the control data is 0, and an adder for adding up outputs of the switches.

8 Claims, 6 Drawing Sheets

DIRECT DIGITAL SYNTHESIZER AND NUCLEAR MAGNETIC RESONANCE INSTRUMENT USING THE SAME

BACKGROUND OF THE INVENTION

The present invention relates to a direct digital synthesizer (hereafter abbreviated to DDS) capable of conducting frequency switching while maintaining phase coherency, and a nuclear magnetic resonance instrument (hereafter abbreviated to NMR instrument) using such a DDS.

The NMR instrument is an instrument which transmits a high-frequency alternating current magnetic field to a molecule placed in a strong static magnetic field, gives perturbation to a nuclear spin in the molecule, and measure a response of the nuclear spin.

The alternating current magnetic field takes a pulse having a definite frequency, phase and amplitude as a basic unit. In experiments using the NMR instrument, a series of pulses which are different in frequency, phase and amplitude are transmitted to the molecule. Such a series of pulses is called pulse sequence. The pulse sequence is designed carefully by an NMR researcher with the object of controlling the nuclear spin state according to the purpose of the experiment. Its example can be seen in Non-Patent Document 1. The number of pulse sequences has already exceeded several hundreds, and it is increasing day by day with the advance of the NMR research.

A high-frequency transmitter (hereafter abbreviated to transmitter) in the NMR instrument generates high-frequency pulses changed in frequency, phase and amplitude in a time of several microseconds or less according to the pulse sequence. In the transmitter which needs fast and highly precise operation, introduction of the DDS was a great breakthrough. The DDS is an integrated circuit for signal generation and modulation using digital techniques, and the DDS can generate frequency-, phase-, and amplitude-modulated pulses at high speed and with high resolution. As regards the DDS, there is a large literature. For example, Non-Patent Document 2 is one of them. An example of a DDS capable of modulation at high speed and with high resolution as a feature is AD9956 produced by Analog Devices.

According to Non-Patent Document 3, the AD9956 can modulate a signal in a band of DC to 200 MHz with a frequency resolution of 1.42 micro hertz and a phase resolution of 0.02 degrees in a time of only 10 nanoseconds. As compared with the conventional analog circuit, the performance of the DDS is several digits higher. The conventional analog circuit has a frequency resolution in the range of 0.1 to 1 Hz and a phase resolution of several degrees, and the conventional analog circuit needs a time in the range of several tens to several hundreds microseconds for modulation.

One problem posed when utilizing the DDS in the transmitter in the NMR instrument is to maintain the phase coherency in frequency modulation. FIG. 2 shows the problem of the phase coherency. When the frequency is changed from F1 to F2 and restored to F1 as shown in A, the output waveform of the DDS changes with a continuous phase at a boundary between frequencies as shown in B. In the NMR instrument, however, phase information is important. Therefore, a waveform which maintains the phase coherency as shown in C is necessary. The phase coherency can be appreciated easily by comparing C, D and E in FIG. 2. In FIG. 2, D and E are two virtual output waveforms respectively maintaining frequencies F1 and F2. In FIG. 2, C has the waveform of D when the output frequency is F1, and has the waveform of E when the output frequency is F2.

In the NMR, it is necessary to maintain the phase coherency between pulses having the same frequency as shown in C in FIG. 2. As represented by B, however, the waveform of the DDS cannot maintain the phase coherency. One clear solution method to this problem is proposed in Patent Document 1. According to the Patent Document 1, a plurality of phase accumulators (hereafter abbreviated to PAs) are mounted on one DDS and one output frequency is assigned to each PA. Phase coherency at each frequency is maintained by the assigned PA. The output frequency of the DDS is changed by changing the PA selected to be used for the output from among a plurality of PAs. The technique disclosed in the Patent Document 1 can satisfy both the frequency modulation using the DDS and maintenance of the phase coherency.

Patent Document 1: Japanese Patent No. 3855237

Non-Patent Document 1: Stefan Berger and Siegmar Braun, "200 And More NMR Experiments: A Practical Course", Wiley-VCH, 2004

Non-Patent Document 2: "A Technical Tutorial on Digital Signal Synthesis", Analog Devices, 1999

Non-Patent Document 3: "AD9956 Data Sheet Rev. A", Analog Devices, 2004

In the technique disclosed in the Patent Document 1, however, the number of frequencies which can be used in the pulse sequence is greatly restricted. In the technique disclosed in the Patent Document 1, an output frequency is assigned to each PA. Therefore, the number of output frequencies which can be used in the pulse sequence coincides with the number of PAs mounted on the DDS. Considering the present state in which the number of pulse sequences continues to be increasing day by day with the advance of the NMR research, it can be expected easily that the number of frequencies required for the pulse sequence will exceed the number of PAs within the life of the NMR instrument even if PAs which are sufficient in number to leave a margin are mounted when the NMR instrument is manufactured. In a worse case, the number of PAs mounted on the NMR instrument leads the research itself of the pulse sequence in a biased direction. In other words, there is even a fear that it might be hesitated to conduct researches in the pulse sequence using frequency modulation because the number of frequencies which can be used in the NMR instrument is small.

SUMMARY OF THE INVENTION

In view of the problems of the conventional technique, an object of the present invention is to provide a DDS remarkably increased in the number of frequencies which can be output while maintaining the phase coherency, and an NMR instrument using such a DDS.

A direct digital synthesizer (hereafter abbreviated to DDS) including phase accumulators and a phase-to-amplitude converter is provided according to the present invention with a plurality of phase accumulators operating with fixed phase increments which are equal to powers of 2, a controller for outputting each bit of a frequency tuning word as control data, a plurality of switches for outputting an output of an associated one of the phase accumulators when an associated one of the control data supplied from the controller is 1 and outputting 0 when the associated one of the control data is 0, and an adder for adding up outputs of the switches are included.

The DDS according to the present invention and the NMR device using the DDS bring about an effect that it is possible to remarkably increase the number of frequencies which can be output while maintaining the phase coherency.

N PAs fixed in phase increment to $2^n$, N switches for selectively connecting outputs of the PAs to an adder, a controller for controlling selection of the switches by utilizing a binary bit representation of a frequency tuning word, and an adder for adding up outputs of the switches are provided. As a result, the number of frequencies which can be output while maintaining the phase coherency is increased to $2^N$.

Other objects, features and advantages of the invention will become apparent from the following description of the embodiments of the invention taken in conjunction with the accompanying drawings.

DETAILED DESCRIPTION OF THE INVENTION (First Embodiment)

Figure 1:
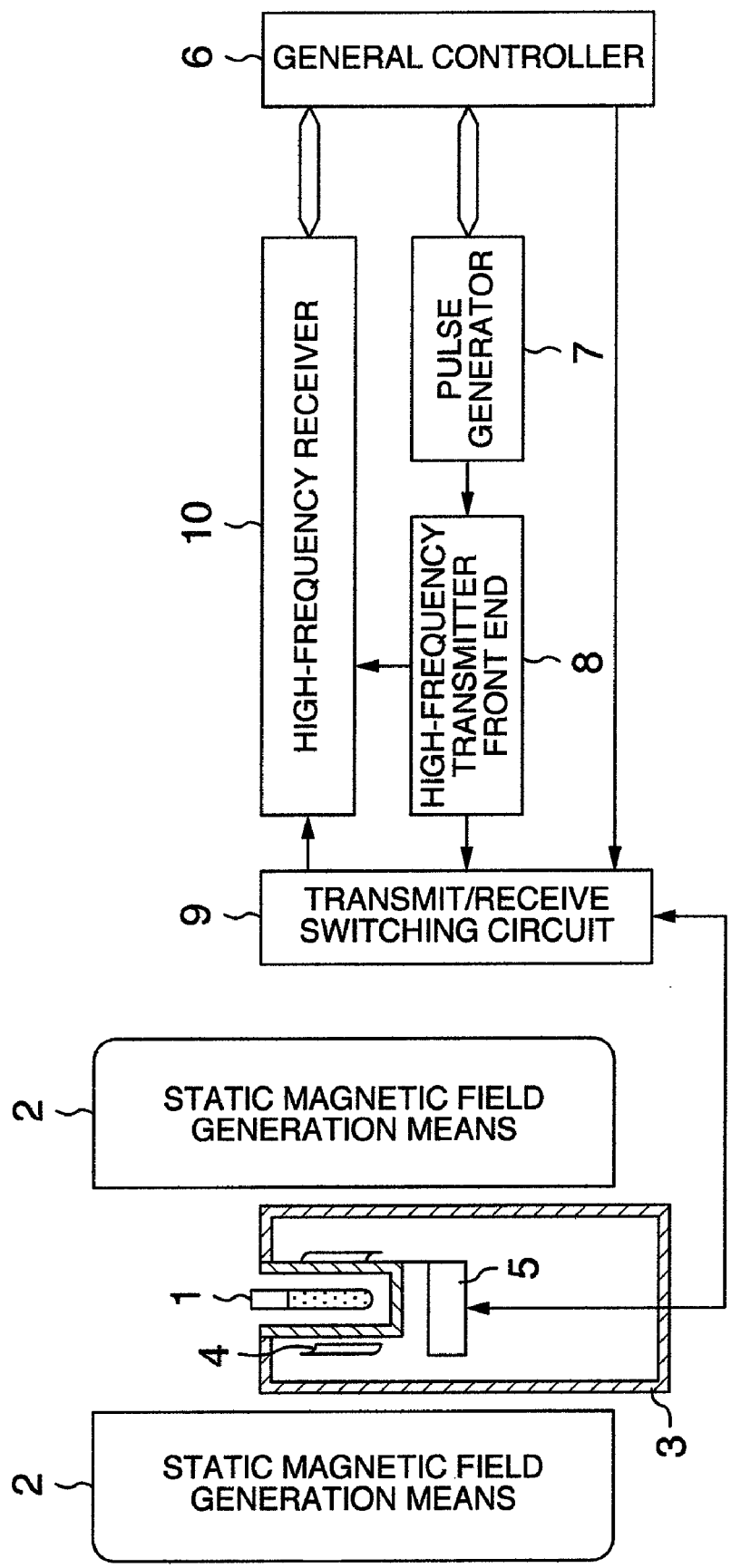
FIG. 1 is a block diagram showing a schematic configuration of an NMR instrument and a direct digital synthesizer.

FIG. 1 is a block diagram showing a schematic configuration of an NMR instrument using a DDS (direct digital synthesizer) according to the present invention. A casing 3 which accommodates high-frequency alternating current magnetic field means (probe) 4 to transmit an alternating current magnetic field is inserted into static magnetic field generation means 2 which generates a strong static magnetic field. The high-frequency alternating current magnetic field means 4 is connected to an external cable at an end of the casing 3 via a high-frequency adjustment circuit 5 by a high-frequency cable.

At the time of measurement, a measurement sample 1 is first placed near the high-frequency alternating current magnetic field means 4. Upon start of measurement, a general controller 6 in the NMR instrument sends pulse sequence data to a pulse generator 7 which uses a DDS. A pulse signal output from the pulse generator 7 is amplified by a high-frequency transmitter front end 8 and input to a transmit/receive switching circuit 9. The high-frequency transmitter front end 8 also has a function of conducting up/down conversion on a frequency as occasion demands and a function of outputting a reference signal for receiving to a high-frequency receiver 10. The transmit/receive switching circuit 9 has a function of connecting the high-frequency adjustment circuit 5 to the high-frequency transmitter front end 8 or the high-frequency receiver 10. The connection state of the transmit/receive switching circuit 9 is controlled by control data output from the general controller 6.

First, the high-frequency adjustment circuit 5 is connected to the high-frequency transmitter front end 8, and a pulse signal output from the high-frequency transmitter front end 8 is transmitted to the measurement sample 1 by the high-frequency alternating current magnetic field means 4. A response of the sample is detected by the high-frequency alternating current magnetic field means 4. In order to send a detected response signal to the high-frequency receiver 10, the transmit/receive switching circuit 9 connects the high-frequency adjustment circuit 5 to the high-frequency receiver 10. The response signal is subjected to receive processing in the high-frequency receiver 10 and provided to the user by the general controller 6.

Figure 3:
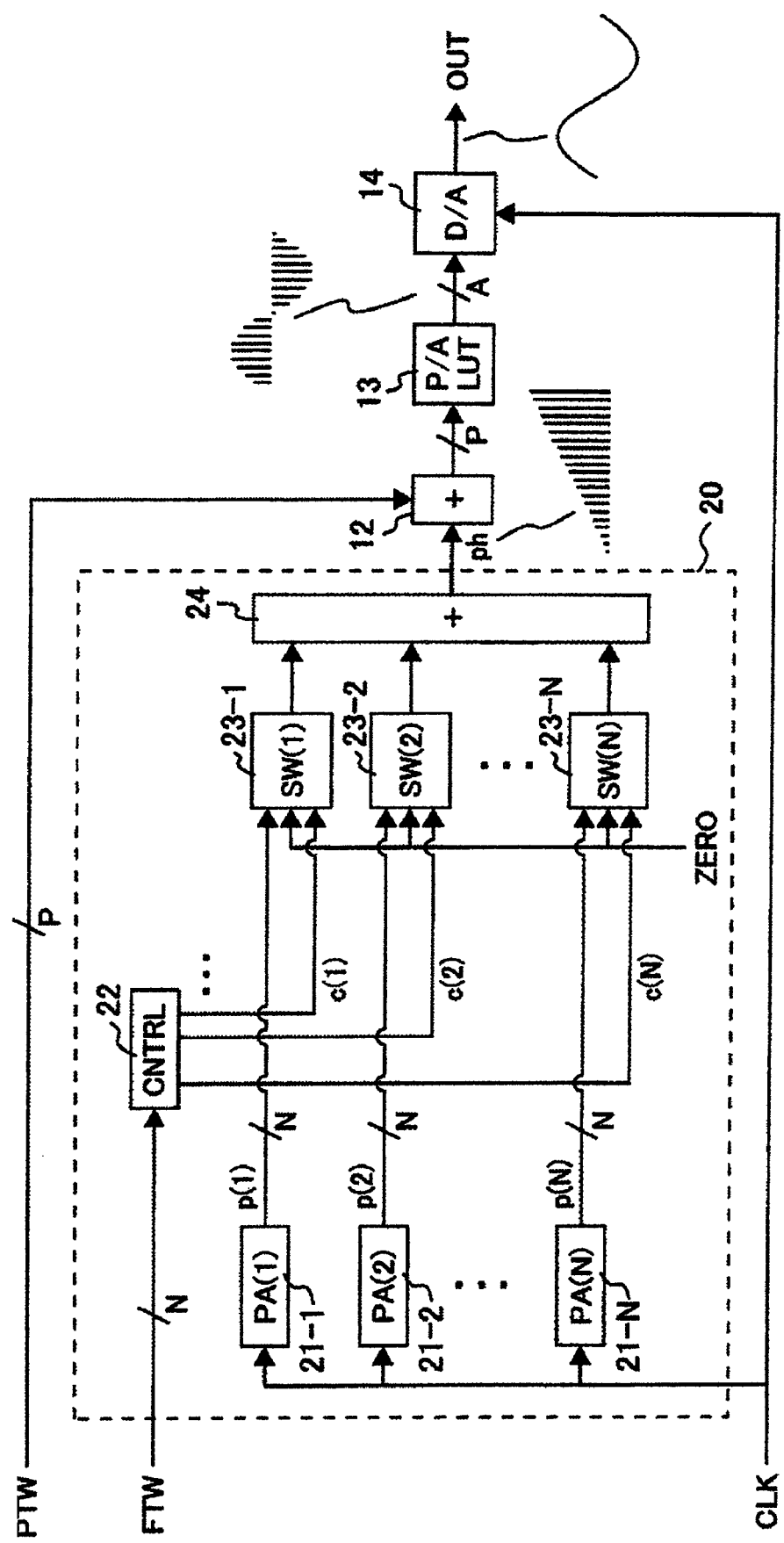
FIG. 3 is a block diagram showing a configuration of a direct digital synthesizer according to a first embodiment of the present invention.

FIG. 3 is a block diagram showing a first embodiment of a DDS according to the present invention. The DDS receives inputs of an N-bit frequency tuning word (FTW) and a P-bit phase tuning word (PTW) from an upper system. The DDS also receives an input of a reference clock signal CLK which serves as a period signal for operating a digital circuit from the upper system.

A feature of the present DDS is present in a phase synthesis unit (PSU) 20. The PSU 20 includes N PAs, i.e., PA(1) 21-1 to PA(N) 21-N, where N corresponds to the number N of bits of the FTW. The PA(1) 21-1 to PA(N) 21-N operate with fixed phase increment values M(1) to M(N) represented by Expression 1.

$$M(1) = 2^0$$
$$M(2) = 2^1$$
$$\ldots$$
$$M(n) = 2^{n-1}$$
$$\ldots$$
$$M(N) = 2^{N-1}$$
(Expression 1)

For example, the PA(2) 21-2 operates with the fixed phase increment M(2)=2, and its output p(2) changes as represented by Expression 2 every CLK. T is an arbitrary number of time-s of CLK.

$$p(2)=0,2,4,\ldots,2\times T,\ldots,2\times(2^{N-1}-2),2\times(2^{N-1}-1),0,$$
$$2,\ldots$$
(Expression 2)

In general, an output p(n, T) of the PA(n) 21-n at the number of times T of CLK becomes as represented by Expression 3.

$$p(n,T)=\text{Mod}(M(n)\times T,2^N), M(n)=2^{n-1}$$
(Expression 3)

Here, Mod(x, a) is a function which returns a remainder value obtained by dividing x by a. Outputs p(1) to p(N) respectively of the PA(1) 21-1 to PA(N) 21-N are input to switches SW(1) 23-1 to SW(N) 23-N, respectively. The switches SW(1) 23-1 to SW(N) 23-N are controlled by control data c(1) to c(N) output from a controller 22, respectively. For example, the output of the switch SW(1) 23-1 becomes p(1) if the signal c(1) is in its high state, whereas it becomes 0 if the signal c(1) is in its low state. The switches SW(2) 23-2 to SW(N) 23-N also operate in the same way as the switch SW(1) 23-1.

The outputs c(1) to c(N) of the controller 22 are determined by the FTW as hereafter described. First, an N-bit FTW input is retained in N registers included in the controller 22 so as to respectively correspond to the N bits. Each of values b(1) to b(N) respectively stored in the N registers has a value of 0 or 1, and it is a value of each of bits obtained when the FTW is represented by using a binary number.

$$FTW = \sum_{n=1}^{N} b(n)2^{n-1} \qquad \text{(Expression 4)}$$

Here, it is necessary to make c(1) to c(N) coincide with the values b(1) to b(N), respectively. Hereafter, outputs of the switches SW(1) 23-1 to SW(N) 23-N will be described. For example, an output ps(2, T) of the switch SW(2) 23-2 at the number of times T of CLK is determined by the output p(2, T) of the PA(2) 21-2 and the output c(2) of the controller 22 as represented by Expression 5.

$$ps(2,T) = b(2) \text{Mod}(2^1 \times T, 2^N) \qquad \text{(Expression 5)}$$

Generalizing Expression 5, the output ps(n, T) of the switch SW(n) 23-n becomes as represented by Expression 6.

$$ps(n,T) = b(n) \text{Mod}(2^{n-1} \times T, 2^N) \qquad \text{(Expression 6)}$$

An adder 24 adds up outputs ps(1, T) to ps(N, T) respectively of the switches SW(1) 23-1 to SW(N) 23-N. An output ph(T) of the adder 24 becomes as represented by Expression 7.

$$ph(T) = \sum_{n=1}^{N} ps(n, T) \qquad \text{(Expression 7)}$$
$$= \sum_{n=1}^{N} b(n) \text{Mod}(2^{n-1} \times T, 2^N)$$

Since b(n) has only a value of 0 or 1, Expression 7 can be rewritten as represented by Expression 8.

$$ph(T) = \sum_{n=1}^{N} \text{Mod}(b(n) \times 2^{n-1} \times T, 2^N) \qquad \text{(Expression 8)}$$
$$= \text{Mod}\left(\sum_{n=1}^{N} (b(n) \times 2^{n-1}) \times T, 2^N\right)$$
$$= \text{Mod}(FTW \times T, 2^N)$$

The output ph of the adder 24 is an output of the PSU 20. The output of the PSU 20 is added to the PTW by a second adder 12 for phase modulation, and a resultant sum is input to a phase-amplitude conversion look up table (PA-LUT) 13. The function of the second adder 12 may be integrated into the PA-LUT 13. The output of the second adder 12 is P-bit data, where P≦N. Only P most significant bits included in the N-bit ph are used, and N-P least significant bits are discarded in order to decrease the quantity of data stored in the PA-LUT 13. A technique for decreasing the quantity of data stored in the PA-LUT 13 by utilizing the discarding and symmetry is disclosed in the Non-Patent Document 2. The PA-LUT 13 retains input value–output value pairs, and outputs A-bit amplitude data corresponding to phase information input from the second adder 12. The A-bit amplitude data is converted to an output signal OUT by a digital/analog converter (D/A) 14, and the output signal OUT is output to the outside of the DDS. The D/A 14 may be removed from the DDS and a separate D/A device may be used. In the case where a separate D/A device is used, the output of the PA-LUT 13 becomes the output of the DDS.

Figure 4:
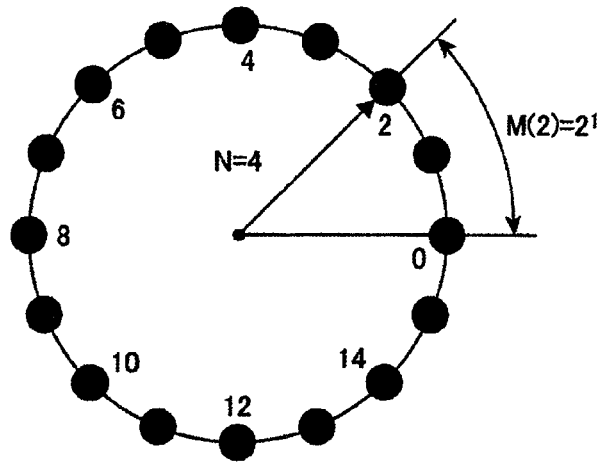
FIG. 4 is a concept diagram showing relations between an output of a phase accumulator and an output of the direct digital synthesizer.

FIG. 4 is a concept diagram of a digital phase wheel for explaining relations between the PA output and the DDS output. An example of the PA(2) with N=4 is shown. Sixteen black points arranged on a circumference as shown in FIG. 4 represent values 0 to 15 which can be output by the PAs with N=4. Since the phase increment of the PA(2) is M(2)=2, the output p(2) of the PA(2) advances two points every time of CLK.

After 14, p(2) returns to 0 again. The PA-LUT 13 outputs a sine wave amplitude at 0 degree, 22.5 degrees, 45 degrees, ..., 337.5 degrees in response to values 0 to 15 which can be output by the PAs with N=4.

In the example shown in FIG. 4, p(2) advances in phase by 45 degrees every time of CLK. One period corresponds to eight times of CLK. Since a time period corresponding to one time of CLK is $dt=1/F_{CLK}$, the digital phase wheel of PA(2) shown in FIG. 4 generates a frequency of $1/(8dt)=F_{CLK}/8$ Hz. Generalizing the number of bits from 4 to N, the period of the output p(2) of the PA(2) is $2^N/M(2)=2^{N-1}$CLK, and a frequency of $M(2)*F_{CLK}/2^N$ Hz is generated.

Considering the number 8 which represents the output ph of the PSU 20, the output ph of the PSU 20 generates a frequency of $FTW*F_{CLK}/2^N$. This frequency becomes a frequency $F_{OUT}$ of the output signal OUT of the DDS. What is to be noted is that the output frequency $F_{OUT}$ of the DDS is changed according to the FTW, but the phase increments M(1) to M(N) respectively of the PA(1) 21-1 to PA(N) 21-N shown in FIG. 3 are fixed regardless of the FTW value. Even if the FTW is changed, only the outputs c(1) to c(N) of the controller 22 change whereas p(1) to p(N) do not change. While the DDS is operating, therefore, the outputs p(1) to p(N) respectively of the PA(1) 21-1 to PA(N) 21-N can always maintain the phase coherency.

The DDS according to the present embodiment having the configuration shown in FIG. 3 includes N PAs, i.e., PA(1) 21-1 to PA(N) 21-N, one controller 22, N switches 23-1 to 23-N, and one adder 24. As a result, frequencies corresponding to all values which can be expressed by the FTW can be output freely while maintaining the phase coherency.

Figure 5:
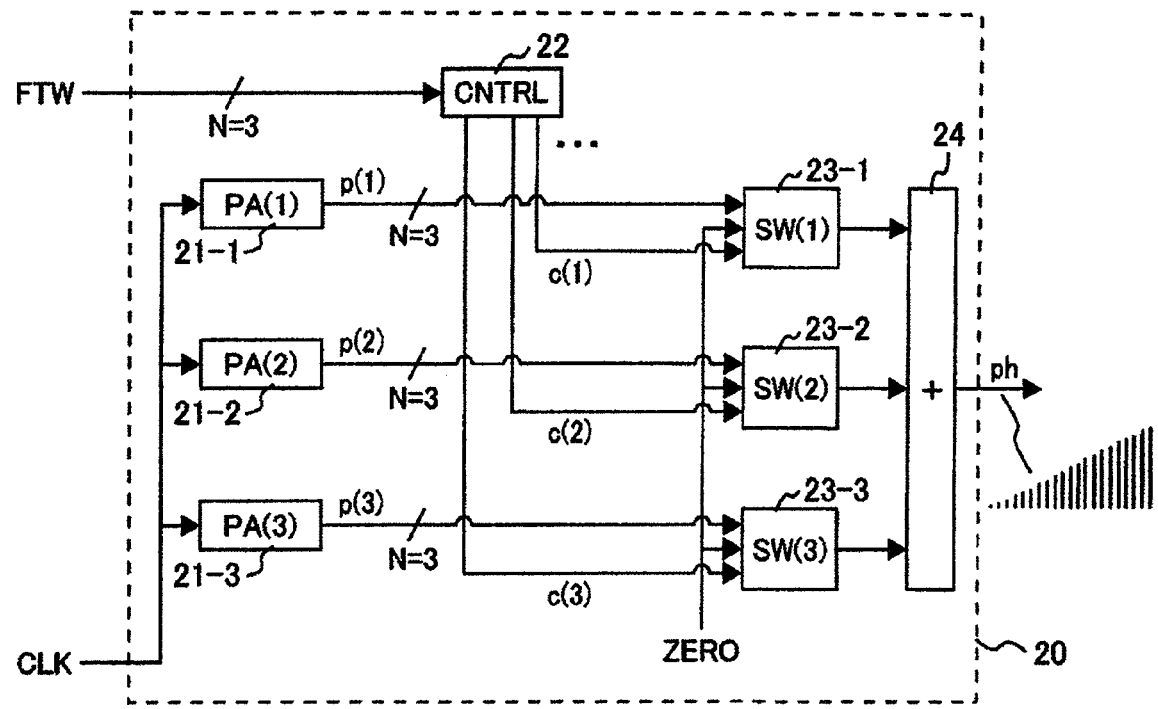
FIG. 5 is a block diagram for explaining an example of operation of the phase accumulator units in the first embodiment.

Operation of the PSU 20 in the first embodiment will now be described with reference to a simple example. If the number of bits of the FTW is N=3, the PSU 20 includes three PAs, i.e., PA(1) 21-1 to PA(3) 21-3 as shown in FIG. 5. Because of the configuration of N=3 bits, each PA can represent a numerical value in the range of 0 to 7. As for the phase increments M(1) to M(3) of each PA, M(1)=1, M(2)=2 and M(3)=4 according to Expression 1. The PA(1) to PA(3) respectively outputs p(1) to p(3) shown in Table 1 according to CLK.

TABLE 1

|      | CLK number | | | | | | | | | |
| ---- | - | - | - | - | - | - | - | - | - | -- |
|      | 1 | 2 | 3 | 4 | 5 | 6 | 7 | 8 | 9 | 10 |
| p(1) | 0 | 1 | 2 | 3 | 4 | 5 | 6 | 7 | 0 | 1  |
| p(2) | 0 | 2 | 4 | 6 | 0 | 2 | 4 | 6 | 0 | 2  |
| p(3) | 0 | 4 | 0 | 4 | 0 | 4 | 0 | 4 | 0 | 4  |

Regardless of the FTW tuning word change, p(1) to p(3) repetitively output numerical values in the range of 0 to 7 as CLK number increases as shown in Table 1.

It will now be exhibited by taking an example that phase coherency is maintained in frequency modulation conducted in the configuration in the first embodiment. A 3-bit FTW tuning word can have a value in the range of 0 to 7. The case where FTW tuning word=3 and the case where FTW tuning word=5 will now be considered as examples. The FTW tuning word=3 is decomposed into bits {0, 1, 1} by the controller 22. The control data c(1) to c(3) output to the three switches 23-1 to 23-3 by the controller 22 become 1, 1, and 0, respectively. The switches 23-1 and 23-2 output p(1) and p(2) according to the control data c(1)=1 and c(2)=1. The switch 23-3 outputs 0. The adder 24 adds up outputs of the switches 23-1 to 23-3, and outputs a least significant 3-bit part of a resultant sum. Therefore, the output of the adder 24 becomes as represented by Expression 7 (or Expression 8). In the CLK number, "d" represents a fixed delay between PA outputs and the adder output. In the adder output shown in Table 2, the phase increment=5 and it coincides with the FTW tuning word.

TABLE 2

| FTW tuning word = 3 | | | | | | | | | | |
|---|---|---|---|---|---|---|---|---|---|---|
| | CLK number | | | | | | | | | |
| | 1 + d | 2 + d | 3 + d | 4 + d | 5 + d | 6 + d | 7 + d | 8 + d | 9 + d | 10 + d |
| SW(1) output | 0 | 1 | 2 | 3 | 4 | 5 | 6 | 7 | 0 | 1 |
| SW(2) output | 0 | 2 | 4 | 6 | 0 | 2 | 4 | 6 | 0 | 2 |
| SW(3) output | 0 | 0 | 0 | 0 | 0 | 0 | 0 | 0 | 0 | 0 |
| Addition | 0 | 3 | 6 | 9 | 4 | 7 | 10 | 13 | 0 | 3 |
| Adder output | 0 | 3 | 6 | 1 | 4 | 7 | 2 | 5 | 0 | 3 |

The case where the FTW tuning word=5 will now be considered. The control data c(1) to c(3) output by the controller 22 become 1, 0, and 1, respectively. The switches 23-1 and 23-3 output p(1) and p(3), respectively. The switch 23-2 outputs 0. In the adder output, the phase increment=5 and it also coincides with the FTW tuning word.

TABLE 3

| FTW tuning word = 5 | | | | | | | | | | |
|---|---|---|---|---|---|---|---|---|---|---|
| | CLK number | | | | | | | | | |
| | 1 + d | 2 + d | 3 + d | 4 + d | 5 + d | 6 + d | 7 + d | 8 + d | 9 + d | 10 + d |
| SW(1) output | 0 | 1 | 2 | 3 | 4 | 5 | 6 | 7 | 0 | 1 |
| SW(2) output | 0 | 0 | 0 | 0 | 0 | 0 | 0 | 0 | 0 | 0 |
| SW(3) output | 0 | 4 | 0 | 4 | 0 | 4 | 0 | 4 | 0 | 4 |
| Addition | 0 | 5 | 2 | 7 | 4 | 9 | 6 | 11 | 0 | 5 |
| Adder output | 0 | 5 | 2 | 7 | 4 | 1 | 6 | 3 | 0 | 5 |

Finally, the case where the FTW tuning word=3 at the start, the FTW tuning word=5 at CLK=4 and the FTW tuning word=3 is restored at CLK=8 will be considered as an example of frequency modulation.

TABLE 4

| FTW tuning word = 3 → 5 → 3 | | | | | | | | | | |
|---|---|---|---|---|---|---|---|---|---|---|
| | CLK number | | | | | | | | | |
| | 1 + d | 2 + d | 3 + d | 4 + d | 5 + d | 6 + d | 7 + d | 8 + d | 9 + d | 10 + d |
| FTW value | | 3 | | | 5 | | | | 3 | |
| SW(1) output | 0 | 1 | 2 | 3 | 4 | 5 | 6 | 7 | 0 | 1 |
| SW(2) output | 0 | 2 | 4 | 0 | 0 | 0 | 0 | 6 | 0 | 2 |
| SW(3) output | 0 | 0 | 0 | 4 | 0 | 4 | 0 | 0 | 0 | 0 |
| Addition | 0 | 3 | 6 | 7 | 4 | 9 | 6 | 13 | 0 | 3 |
| Adder output | 0 | 3 | 6 | 7 | 4 | 1 | 6 | 5 | 0 | 3 |

It is appreciated from Table 4 that the phase increment of the adder output coincides with the changing FTW tuning word. The adder output has a different phase increment as a transition state between CLK 3 and CLK 4 and between CLK 7 and CLK 8 during which the FTW tuning word is changed over. Since the CLK period is typically several tens nanoseconds or less, however, there are no practical problems. It is apparent that the phase coherency is maintained, by comparing the adder output shown in Table 4 with the adder outputs shown in Table 2 and Table 3. The adder output shown in Table 4 coincides with the adder output shown in Table 2 during the time period when the FTW tuning word=3 and coincides with the adder output shown in Table 3 during the time period when the FTW tuning word=5.

Heretofore, the operation of the PSU 20 in the first embodiment of the present invention has been described with reference to a simple example. The bit length N of the actually used FTW is at least eight. In that case as well, however, the phase coherency at the time of frequency modulation can be maintained by the same operation.

(Second Embodiment)

Figure 6:
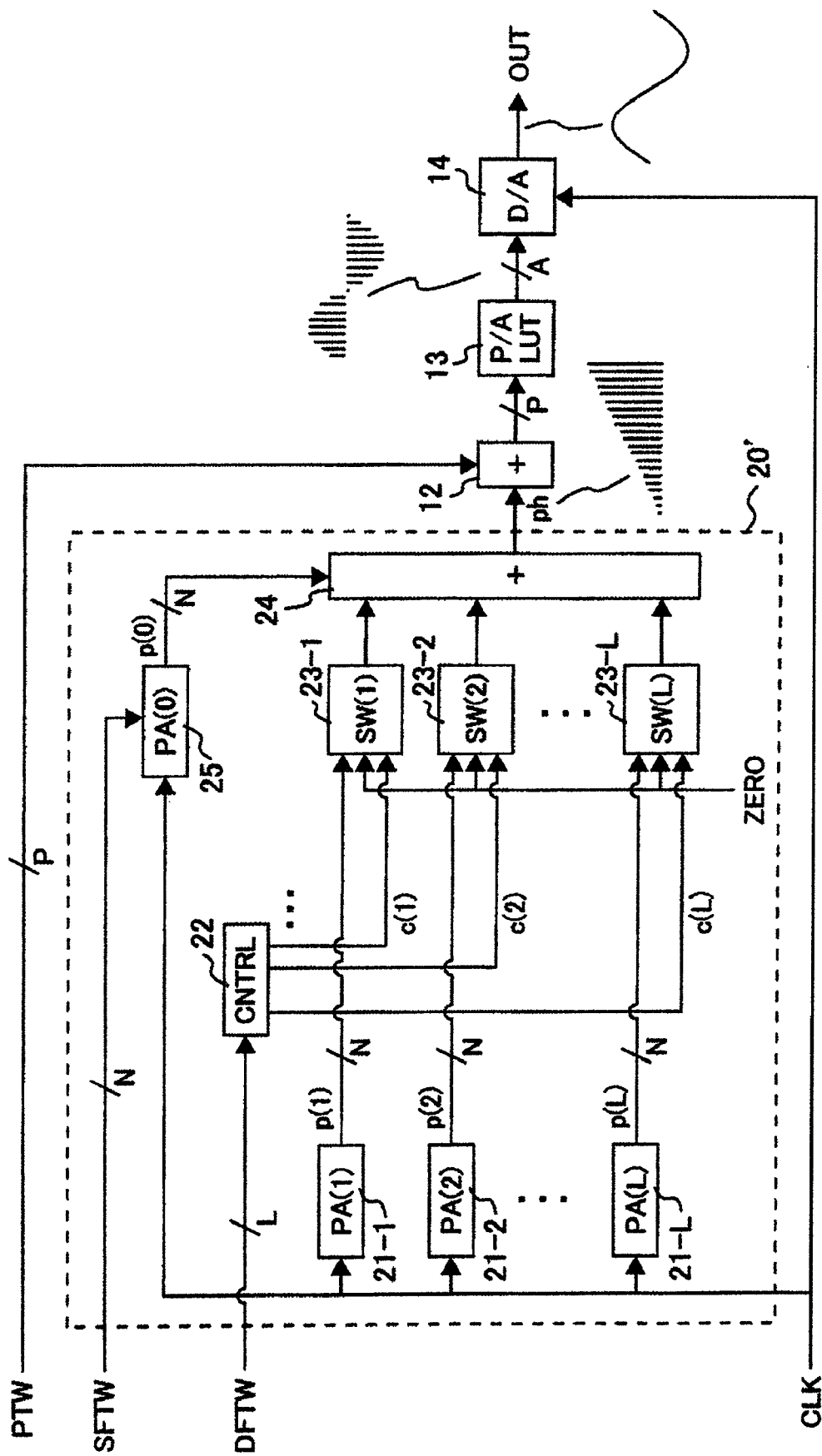
FIG. 6 is a block diagram showing a configuration of a direct digital synthesizer according to a second embodiment.

FIG. 6 is a block diagram showing a second embodiment of the present invention. In the second embodiment shown in FIG. 6, the frequency tuning word FTW is divided to a static frequency tuning word SFTW which does not change during the transmission of the pulse sequence and a dynamic frequency tuning word DFTW which changes during the transmission of the pulse sequence.

The frequency which can be output by the DDS is in the range of 0 Hz to $F_{CLK}/2$ Hz according to Expression 8. Since $F_{CLK}$ used in the modern DDS amounts to several hundreds MHz to several GHz, the output range of the DDS becomes hundred MHz order. In many cases, however, the range of frequency used in the NMR pulse sequence is within several MHz. Considering this point, the frequency range which needs to be set by the pulse sequence without limiting the degree of freedom of NMR experiments can be made smaller than the frequency range which can be output by the DDS. Reflecting this point, in the embodiment shown in FIG. 6, the SFTW for setting all frequency tuning bits N of the DDS and the DFTW for setting L bits which need to be set in the pulse sequence are separated from each other.

The SFTW is set once before the pulse sequence transmission is started. After the pulse sequence transmission is started, only the DFTW is set. The SFTW sets PA(0) 25 which outputs a fixed frequency. An output p(0) of the PA(0) 25 always has a phase increment of the SFTW. On the other hand, the L-bit DFTW is converted to control data c(1) to c(L) by the controller 22 to control switches 23-1 to 23-L in the same way as the FTW in the first embodiment.

In the DDS according to the second embodiment having the configuration shown in FIG. 6, the number of frequencies which can be output while maintaining the phase coherency is smaller as compared with the DDS according to the first embodiment. However, the DDS according to the second embodiment has an advantage that the time required for the frequency modulation becomes short because the number of bits in the DFTW is small. Furthermore, the DDS according to the second embodiment also has an advantage that the circuit scale of the whole DDS becomes small and the mounting area and power dissipation are reduced because the number of PAs and the number of switches become smaller than those in the first embodiment.

(Third Embodiment)

Figure 7:
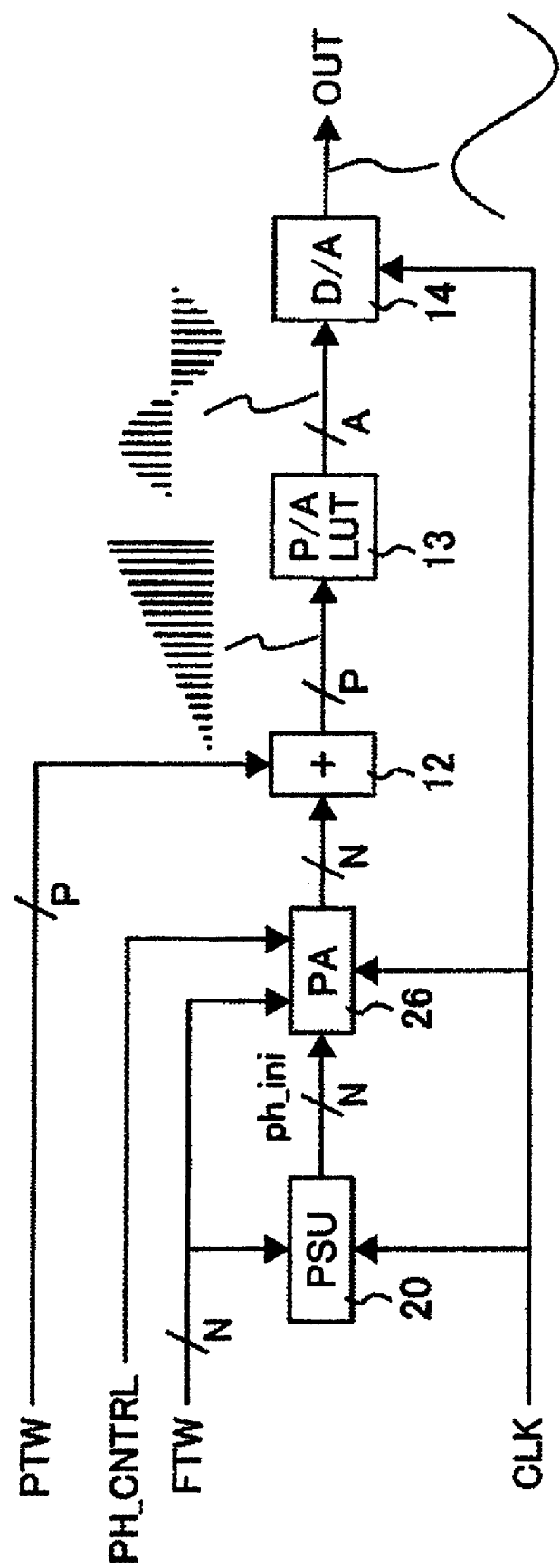
FIG. 7 is a block diagram showing a configuration of a direct digital synthesizer according to a third embodiment.

FIG. 7 is a block diagram showing a third embodiment of the present invention. In the embodiment shown in FIG. 7, an output ph_ini of the PSU 20 according to the present invention is used as an initial phase of another PA 26. The FTW is set in both the PSU 20 and the PA 26. PH_CNTRL is control data for setting whether to use the output ph_ini of the PSU 20 as an initial phase of the PA 26 when the FTW is changed or use a phase possessed by the PA 26 at a CLK immediately before the FTW is changed, as the initial phase.

Figure 2:
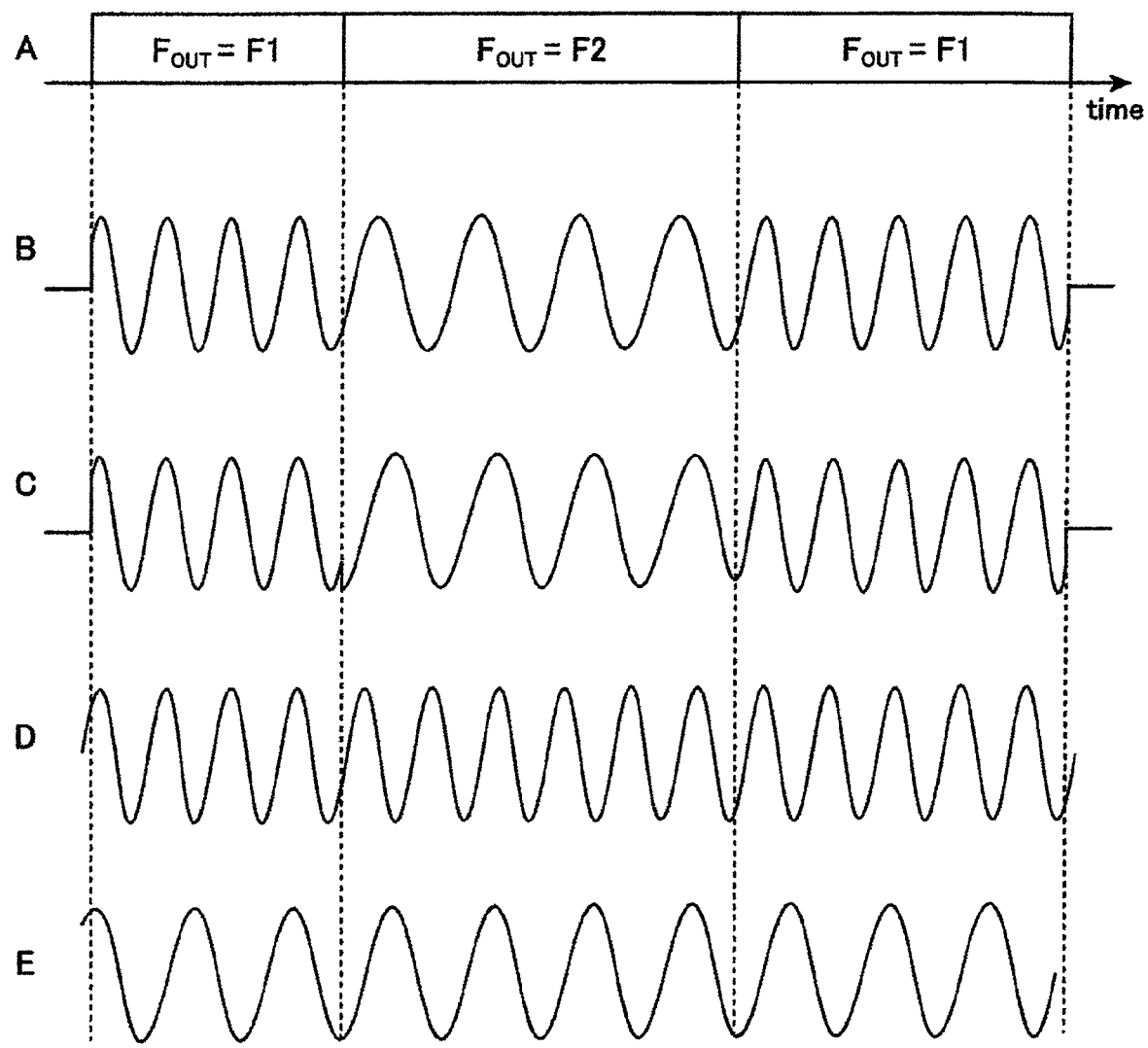
FIG. 2 is a concept diagram for explaining phase coherency of a waveform in frequency switching.

In the DDS according to the present embodiment having the configuration shown in FIG. 7, the circuit scale becomes large because the number of PAs is increased by one. However, the DDS according to the present embodiment has an advantage that the output waveform obtained when the FTW is changed over can be made either of the waveforms B and C shown in FIG. 2. By the way, in FIG. 7, the configuration according to the first embodiment is utilized and the FTW and the PSU 20 are used. Alternatively, the present embodiment can also be applied to the configuration including the SFTW, the DFTW, the PSU20' and the PA(0) 25 according to the second embodiment.

The apparatus according to the present invention can be applied not only to nuclear magnetic resonance instruments but also to magnetic resonance imaging instruments (MRIs) or the like which change over the frequency at high speed and output signals while maintaining the phase coherency.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A direct digital synthesizer comprising a phase synthesis unit and a phase-to-amplitude converter, the phase synthesis unit comprising:
a plurality of phase accumulators operating with fixed phase implements which are equal to powers of 2;
a controller for outputting each bit of a frequency tuning word as control data;
a plurality of switches for outputting an output of an associated one of the phase accumulators when an associated one of the control data supplied from the controller is 1 and outputting 0 when the associated one of the control data is 0; and
an adder for adding up outputs of the switches.

2. A nuclear magnetic resonance instrument including means for providing a measurement sample with a static magnetic field and means for providing the measurement sample with an alternating current magnetic field, wherein the direct digital synthesizer according to claim 1 is used to generate the alternating current magnetic field.

3. The direct digital synthesizer according to claim 1, further comprising:
a third phase accumulator provided after the adder to receive an output of the adder, the frequency tuning word, and a phase control signal,
wherein
an output frequency of the third phase accumulator is controlled by the frequency tuning word, and
an initial phase of the third phase accumulator at time of frequency changeover is selected from either the output of the adder or a phase possessed by the third phase accumulator immediately before the frequency is changed over, by the phase control signal.

4. A nuclear magnetic resonance instrument including means for providing a measurement sample with a static magnetic field and means for providing the measurement sample with an alternating current magnetic field, wherein the direct digital synthesizer according to claim 3 is used to generate the alternating current magnetic field.

5. The direct digital synthesizer according to claim 1, wherein the frequency tuning word comprises a static frequency tuning word that does not change during transmission of a pulse sequence and a dynamic frequency tuning word that changes during transmission of a pulse sequence and is input to the controller, the phase synthesis unit further comprising:
a second phase accumulator provided separately from the plurality of phase accumulators and controlled by the static frequency tuning word; and
wherein said adder adds an output of the second phase accumulator and the outputs of the switches.

6. A nuclear magnetic resonance instrument including means for providing a measurement sample with a static magnetic field and means for providing the measurement sample with an alternating current magnetic field, wherein the direct digital synthesizer according to claim 5 is used to generate the alternating current magnetic field.

7. The direct digital synthesizer according to claim 5, further comprising:
a third phase accumulator provided after the adder to receive an output of the adder, the frequency tuning word, and a phase control signal,
wherein
an output frequency of the third phase accumulator is controlled by the frequency tuning word, and an initial phase of the third phase accumulator at time of frequency changeover is selected from either the output of the adder or a phase possessed by the third phase accumulator immediately before the frequency is changed over, by the phase control signal.

8. A nuclear magnetic resonance instrument including means for providing a measurement sample with a static magnetic field and means for providing the measurement sample with an alternating current magnetic field, wherein the direct digital synthesizer according to claim 7 is used to generate the alternating current magnetic field.

* * * * *